US012683612B2

(12) United States Patent
Hou et al.

(10) Patent No.: US 12,683,612 B2
(45) Date of Patent: Jul. 14, 2026

(54) GPIO CIRCUIT AND CHIP

(71) Applicant: GIGADEVICE SEMICONDUCTOR INC., Beijing (CN)

(72) Inventors: Dequan Hou, Beijing (CN); Zhi Liu, Beijing (CN)

(73) Assignee: GIGADEVICE SEMICONDUCTOR INC., Beijing (CN)

( * ) Notice: Subject to any disclaimer, the term of this patent is extended or adjusted under 35 U.S.C. 154(b) by 57 days.

(21) Appl. No.: 18/809,896

(22) Filed: Aug. 20, 2024

(65) Prior Publication Data

US 2025/0125805 A1 Apr. 17, 2025

(30) Foreign Application Priority Data

Oct. 13, 2023 (CN) .......................... 202311329987.7

(51) Int. Cl.
H03K 19/0185 (2006.01)
H03K 17/687 (2006.01)
H03K 19/003 (2006.01)

(52) U.S. Cl.
CPC . H03K 19/018521 (2013.01); H03K 17/6872 (2013.01); H03K 17/6877 (2013.01); H03K 19/00361 (2013.01); H03K 19/00384 (2013.01)

(58) Field of Classification Search
CPC ....... H03K 19/018521; H03K 17/6872; H03K 17/6877; H03K 19/00361; H03K 19/00384
See application file for complete search history.

(56) References Cited

U.S. PATENT DOCUMENTS

| | | | |
|---|---|---|---|
| 5,218,239 A | 6/1993 | Boomer | |
| 6,255,867 B1 * | 7/2001 | Chen ................ | H03K 19/00361 |
| | | | 327/437 |
| 6,768,363 B2 * | 7/2004 | Yoo ...................... | H03K 17/164 |
| | | | 327/170 |
| 7,626,423 B1 * | 12/2009 | Li .................. | H03K 19/018585 |
| | | | 326/38 |
| 2006/0012406 A1 * | 1/2006 | Huber .................. | H03K 17/163 |
| | | | 327/112 |
| 2012/0025866 A1 | 2/2012 | Sohn | |

* cited by examiner

*Primary Examiner* — Daniel D Chang
(74) *Attorney, Agent, or Firm* — Ziegler IP Law Group, LLC.

(57) ABSTRACT

A GPIO circuit and a chip are provided. The GPIO circuit includes at least one output driver branch each including output driver transistor. A gate of the output driver transistor is coupled to a respective pre-driver circuit including a conventional pre-driver circuit, a pre-driver transistor and a slow pre-driver (SPD) circuit. An output of the conventional pre-driver circuit is coupled to the gate of the output driver transistor, and a gate of the pre-driver transistor is coupled to a slope control signal. A drain of the pre-driver transistor is coupled to one terminal of the conventional pre-driver circuit. The SPD circuit is coupled between a source and the drain of the pre-driver transistor. In order to output a signal, the SPD circuit is turned on, and the conventional pre-driver circuit is turned on under the control of the signal to be output.

17 Claims, 9 Drawing Sheets

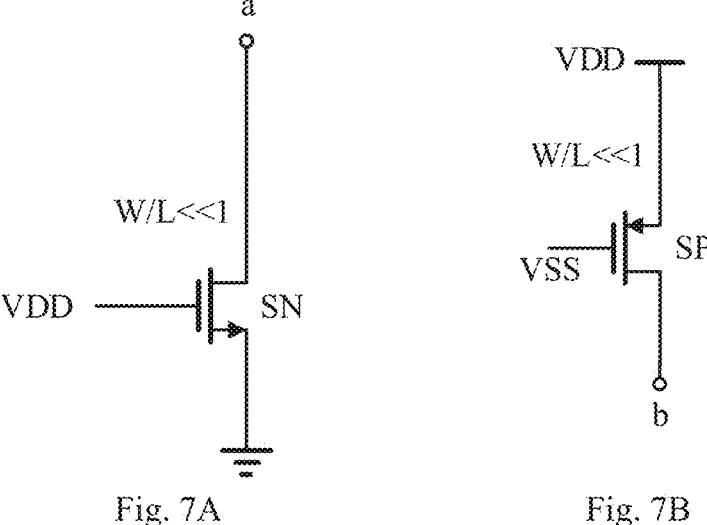
Fig. 7A                              Fig. 7B
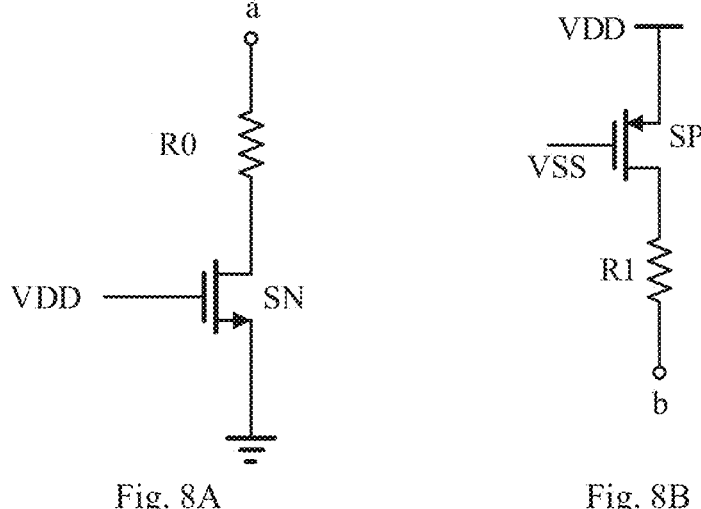
Fig. 8A                              Fig. 8B

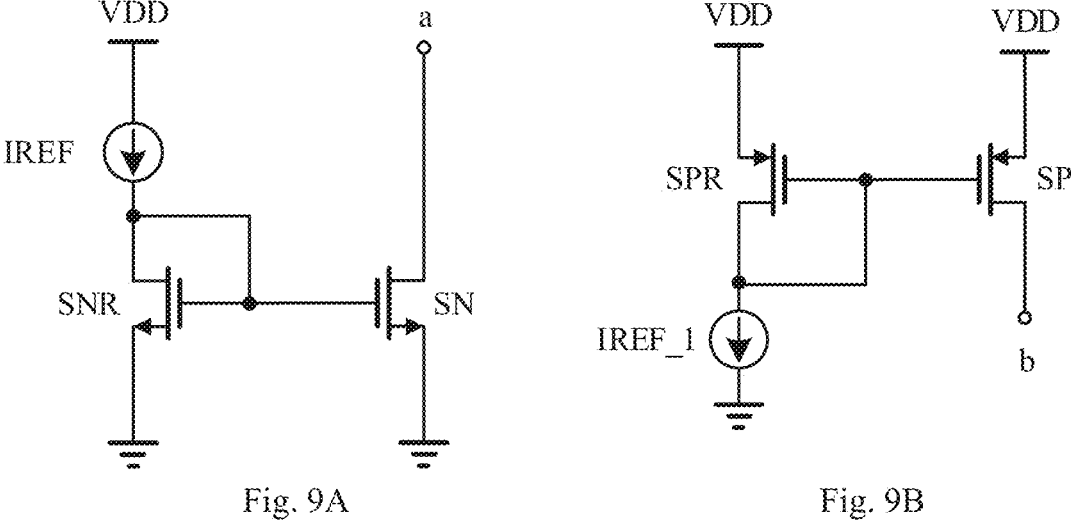
Fig. 9A                                   Fig. 9B
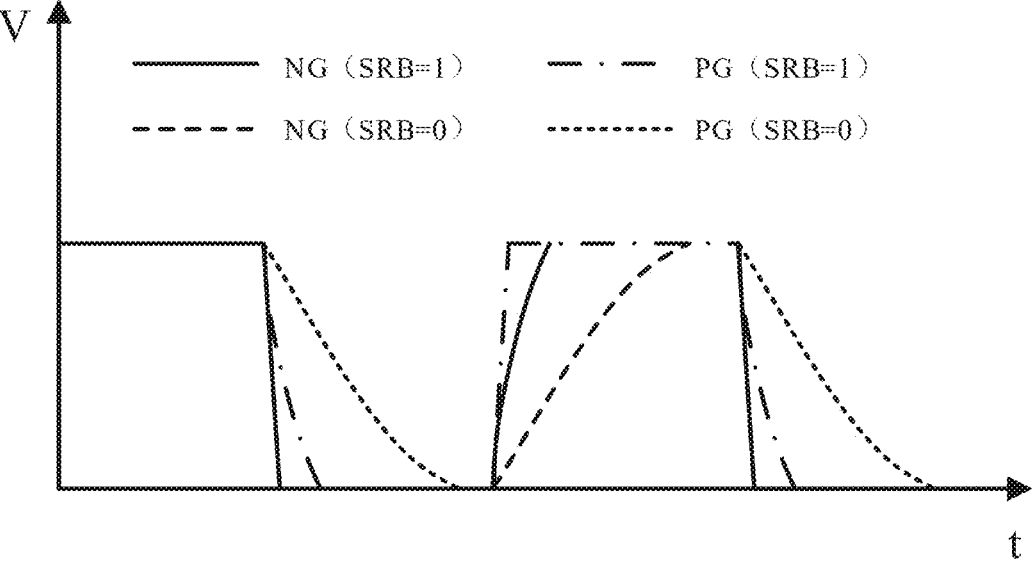
Fig. 10

GPIO CIRCUIT AND CHIP

CROSS-REFERENCE TO RELATED APPLICATION

This application claims the priority of Chinese patent application number 202311329987.7, filed on Oct. 13, 2023 and entitled "GPIO CIRCUIT AND CHIP", the entire contents of which are incorporated herein by reference.

TECHNICAL FIELD

The present invention relates to the field of integrated circuits, and in particular, to a general-purpose input/output (GPIO) circuit and a chip.

BACKGROUND

As an interface circuit of a chip, a general-purpose input/output (GPIO) circuit functions to transmit an internal signal out of the chip and to receive an external signal and pass the external signal into the chip. FIG. 1 shows the basic structure of a GPIO circuit. In order to prevent the generation of a shoot-through current from a power supply node VDD to the ground through a pull-up output driver transistor MP and a pull-down output driver transistor MN, it is necessary to separately control gates of these output driver transistors MP, MN. Specifically, a PMOS pre-driver circuit 12 may be used to control the gate of the pull-up output driver transistor MP, and an NMOS pre-driver circuit 11 may be used to control the gate of the pull-down output driver transistor MN.

Considering a large off-chip capacitive load to be driven (not shown, possibly as large as tens to hundreds of pF), the GPIO circuit generally has high drive power. However, due to the presence of parasitic inductances in the package and PCB of the chip, significant ringing may be present in the output waveform when a steeply sloped transient current output from the GPIO circuit flows through such a parasitic inductance. Additionally, if transient currents are simultaneously output from multiple GPIO circuits (i.e., multiple GPIO interfaces) in the chip over a short time interval, voltage fluctuations, also known as simultaneous switching noise (SSN), may be introduced to the power supply VDD and ground nodes within the chip, which may degrade device reliability and cause error inversion of logic gates in the chip.

However, currently available modified GPIO circuits are somewhat deficient and cannot meet the requirements of various applications.

SUMMARY OF THE INVENTION

The present invention provides a general-purpose input/output (GPIO) circuit, comprising at least one output driver branch each including output driver transistors, wherein: each output driver transistor comprises a drain coupled to a GPIO pin, a gate coupled to a corresponding pre-driver circuit, wherein the pre-driver circuit comprises:

a conventional pre-driver circuit comprising an input terminal coupled to a signal to be output and an output terminal coupled to a gate of a corresponding output driver transistor;

a pre-driver transistor comprising a gate coupled to a slope control signal and a drain coupled to one terminal of the conventional pre-driver circuit; and an SPD circuit coupled between a source and the drain of the pre-driver transistor;

wherein when the slope control signal is so configured that the pre-driver transistor is turned on, the SPD circuit and the conventional pre-driver circuit are turned on, and the output driver transistor is turned on in a normal mode; and when the slope control signal is so configured that the pre-driver transistor is turned off, the SPD circuit and the conventional pre-driver circuit are turned on, and a corresponding output driver transistor is turned on in a slope-controlled mode, in which the corresponding output driver transistor is turned on more slowly than in the normal mode.

On the basis of the same concept, the present invention also provides a chip comprising a logical processing unit, one or more GPIO pins and at least one GPIO circuit each coupled between the logical processing unit and the corresponding GPIO pin. Some or all of the GPIO circuits coupled to the GPIO pins are each implemented as the GPIO circuit as defined above. This can enhance reliability in transmission of signals out of and into the chip and prevent logic errors in signal transmission.

BRIEF DESCRIPTION OF THE DRAWINGS

Those of ordinary skill in the art would appreciate that the accompanying drawings are provided to facilitate a better understanding of the present invention and do not limit the scope thereof in any sense, in which:

FIGS. 7A and 7B are schematic diagrams showing the structure of a first example of SPDp and SPDn circuits in the GPIO circuit according to the first embodiment of the present invention;

FIGS. 8A and 8B are schematic diagrams showing the structure of a second example of SPDp and SPDn circuits in the GPIO circuit according to the first embodiment of the present invention;

FIGS. 9A and 9B are schematic diagrams showing the structure of a third example of SPDp and SPDn circuits in the GPIO circuit according to the first embodiment of the present invention;

FIG. 10 schematically illustrates a comparison made between timings of pre-driver signals in the GPIO circuits of FIGS. 1 and 6;

DETAILED DESCRIPTION

Figure 1:
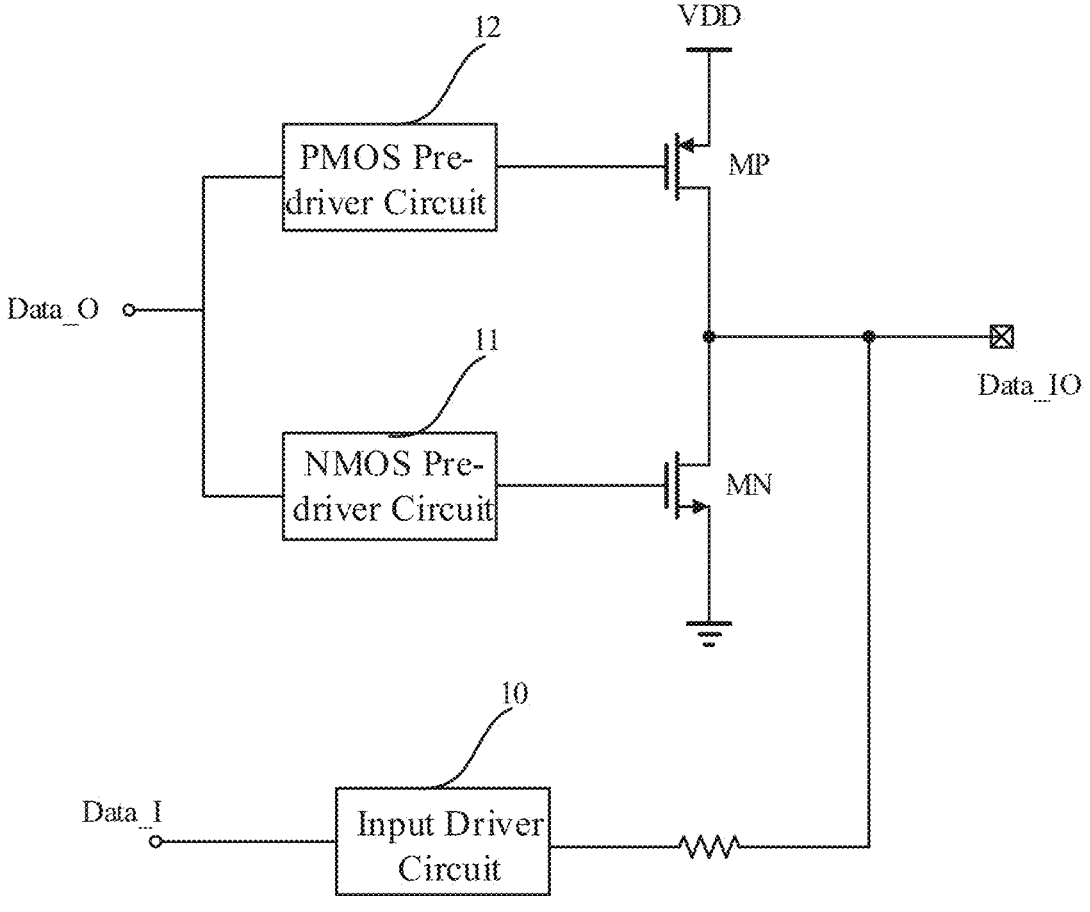
FIG. 1 shows the basic structure of a GPIO circuit.

The following description sets forth numerous specific details in order to provide a more thorough understanding of the present invention. However, it will be apparent to those skilled in the art that the present invention can be practiced without one or more of these specific details. In other instances, well-known technical features have not been described in order to avoid unnecessary obscuring of the invention. It is understood that the invention may be embodied in many different forms and should not be construed as being limited to the embodiments set forth below. Rather, these embodiments are provided so that this disclosure is thorough and conveys the scope of the invention to those skilled in the art. In the drawings, same reference numerals refer to same elements throughout. It will be understood that when an element is referred to as being "connected to" or "coupled to" another element, it can be directly connected or coupled to the other element, or intervening elements may also be present. In contrast, when an element is referred to as being "directly connected to" another element, there are no intervening elements. As used herein, the singular forms "a", "an" and "the" are intended to include the plural forms as well, unless the context clearly indicates otherwise. It will be further understood that the term "comprising" specifies the presence of stated features, steps, operations, elements, and/or components, but do not preclude the presence or addition of one or more other features, steps, operations, elements, components, and/or groups thereof. As used herein, the term "and/or" includes any and all combinations of the associated listed items.

As described in the Background section, due to the presence of parasitic inductances in the package and PCB of a conventional chip, significant ringing may be present in the output waveform when a steeply sloped transient current output from a GPIO circuit in the chip flows through such a parasitic inductance. Additionally, simultaneous outputs from multiple GPIO circuits (i.e., multiple GPIO interfaces) in the chip over a short time interval may cause simultaneous switching noise (SSN), which may degrade device reliability and cause error inversion of logic gates in the chip.

Figure 2:
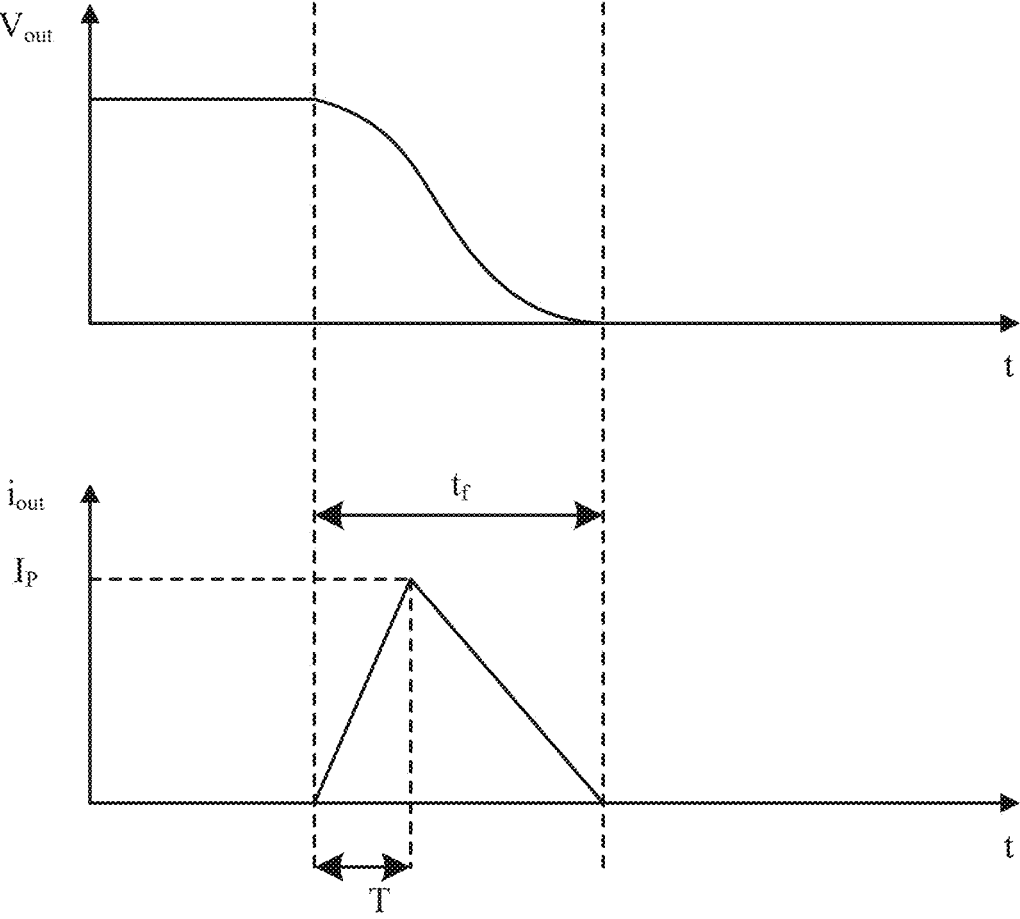
FIG. 2 schematically depicts the waveform of a transient current from the GPIO circuit of FIG. 1, which has been approximated as a triangular wave.

For example, consider the case of a ground node in the chip. Assuming a path from the ground node to an ideal ground has a parasitic inductance L, when a transient current i(t) flows through the parasitic inductance L, a voltage will be generated and given as:

$$V_n(t) = L\frac{di(t)}{dt},$$

where $V_n(t)$ is voltage noise present at the ground node in the chip with respect to the ideal ground. The waveform of the transient current i(t) can be approximated as a triangular wave $i_{out}$, as shown in FIG. 2, having a peak value $I_P$ (corresponding to a peak value of the transient current) and lasting for a period $t_f$. As the current $i_{out}$ rises from zero to the peak value $I_P$ within a time T (corresponding to a rise of the transient current from zero to the peak value), the maximum voltage noise can be expressed as:

$$V_{nmax} = L\frac{I_P}{T}.$$

As can be seen, the maximum voltage noise $V_{nmax}$ can be reduced either by reducing the parasitic inductance L or the peak value $I_P$ of the transient current, or by extending the time T it takes for the transient current to reach the peak value (i.e., reducing the slope of the transient current).

Figure 3:
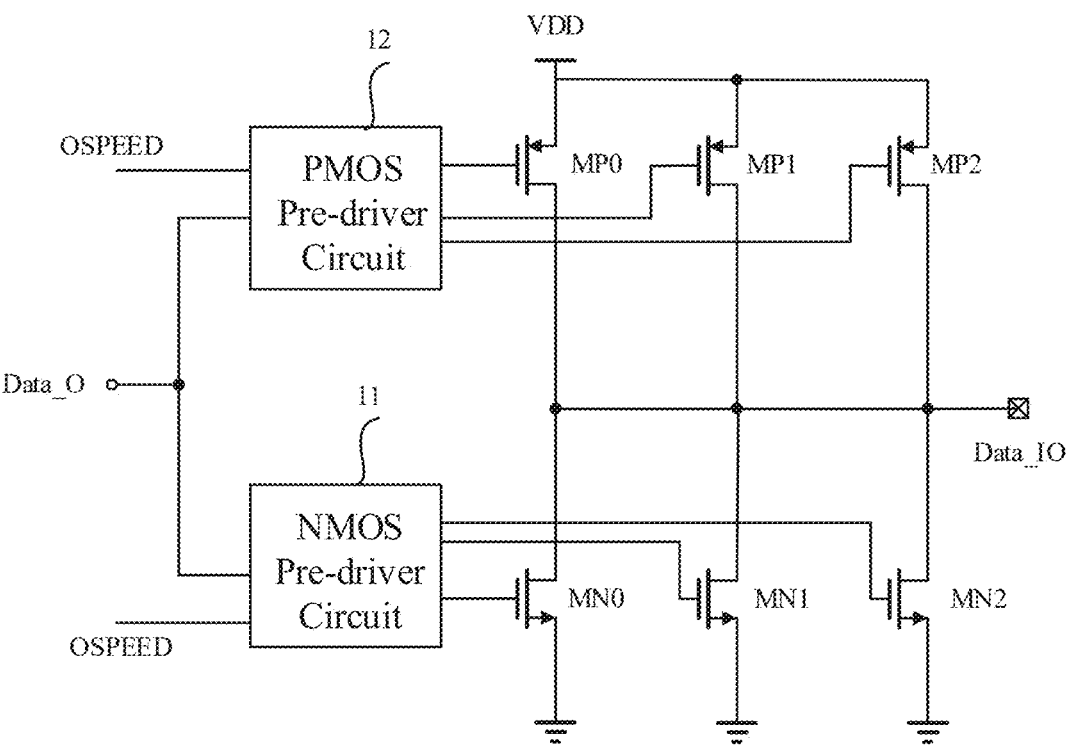
FIG. 3 is a schematic diagram showing the structure of an improved GPIO circuit.

In order to achieve reduced maximum voltage noise $V_{nmax}$, a GPIO circuit including output driver transistors, which are turned on group-wise, as shown in FIG. 3, has been proposed. Specifically, the output driver transistors are divided into three groups, namely, a first group consisting of output driver transistors MP0, MN0, a second group consisting of output driver transistors MP1, MN1, and a third group consisting of output driver transistors MP2, MN2. One, two or all of the three groups of output driver transistors can be selectively turned on simply by appropriately configuring a selection signal OSPEED. When only the first group of output driver transistors is turned on, small overshoots will occur in the output waveform. When the three groups of output driver transistors are all turned on, a high-frequency signal will be output. This improved GPIO circuit achieves a reduced transient current peak $I_P$, and hence reduced overshoots or SSN, by turning on a smaller number of output driver transistors. However, it cannot meet the requirements of various applications that require both reduced overshoots in the output waveform and strong DC pull-up or DC pull-down drive capability.

Figure 4:
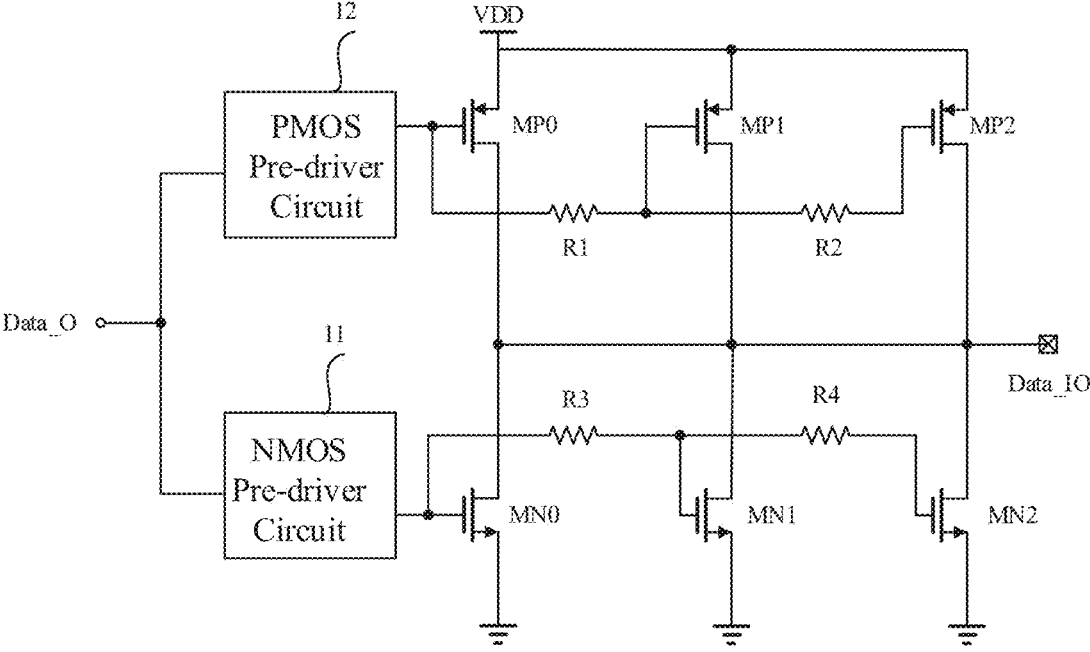
FIG. 4 is a schematic diagram showing the structure of another improved GPIO circuit.

In order to achieve reduced maximum voltage noise $V_{nmax}$, another GPIO circuit including output driver transistors, which are turned on stage-wise, has been proposed. Specifically, the output driver transistors are also divided into three groups, namely, a first group consisting of output driver transistors MP0, MN0, a second group consisting of output driver transistors MP1, MN1, and a third group consisting of output driver transistors MP2, MN2. The GPIO circuit further includes a PMOS pre-driver circuit 12 and an NMOS pre-driver circuit 11, outputs of which are both directly coupled to the first group of output driver transistors but separated from the second and third groups of output driver transistors by resistors (e.g., R1 to R4 of FIG. 4). The first group of output driver transistors constitutes a first circuit stage, the second group of output driver transistors and the resistors R1 and R3 constitute a second circuit stage, and the third group of output driver transistors and the resistors R2 and R4 constitute a third circuit stage. The output driver transistors in the GPIO circuit are turned on stage by stage due to the resistances R1 to R4 and parasitic capacitances at gates of the output driver transistors (i.e., T is increased). As a result, it outputs a less steeply sloped transient current, thereby reducing overshoots or SSN in the output waveform. However, as the output driver transistors are turned on stage-wise, this GPIO circuit has a limited output frequency, which makes it unsuitable for use in applications that require a high-frequency output signal (e.g., as high as 200 MHz, according to some protocols) and a small off-chip capacitive load (usually only a few pF, and hence a small transient current peak $I_P$).

To overcome the above problems, the present invention proposes an improved GPIO circuit and a chip. The GPIO circuit has improvement on the pre-driver circuits coupled to the output driver transistors in the conventional GPIO circuit. On a basis of the conventional pre-driver circuit, a pre-driver transistor controlled by a slope control signal SRB and a slow pre-driver (SPD) circuit connected between a source and a drain of the pre-driver transistor are added to the conventional pre-driver circuits. In response to a need for outputting signal, the SPD circuit is turned on, causing the conventional pre-driver circuit to be turned on under the control of a signal to be output. Moreover, the slope control signal SRB is configured so that the pre-driver transistor is turned on or off. In this way, the output driver transistors can be turned on either in a common output mode, or in a slope-controlled mode. In the slope-controlled output mode, the output driver transistors are turned on more slowly than in the normal mode, allowing reduced overshoots or SSN in the output waveform of the GPIO circuit. The chip may include a plurality of such GPIO circuits, which can be controlled separately to allow the chip to be used flexibly and better meet the requirements of various applications.

The present invention will be described in greater detail below with reference to the accompanying drawings which illustrate specific embodiments thereof. From the following description, advantages and features of the invention will become more apparent. Note that the figures are provided in a very simplified form not necessarily drawn to exact scale and only for the sake of easier and clearer description of the embodiments disclosed herein.

Embodiment 1

Figure 5:
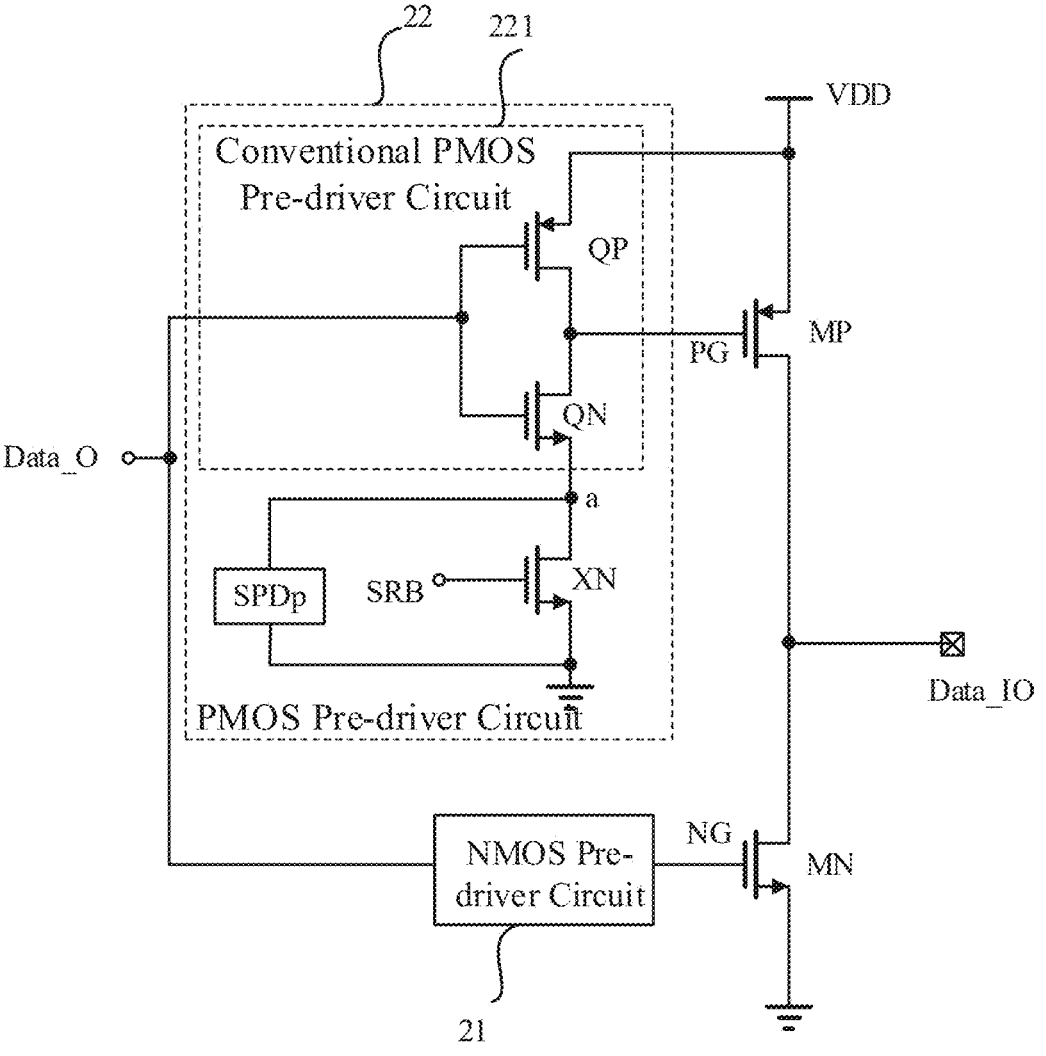
FIG. 5 is a schematic diagram showing the structure of one example of a GPIO circuit according to a first embodiment of the present invention.
Figure 6:
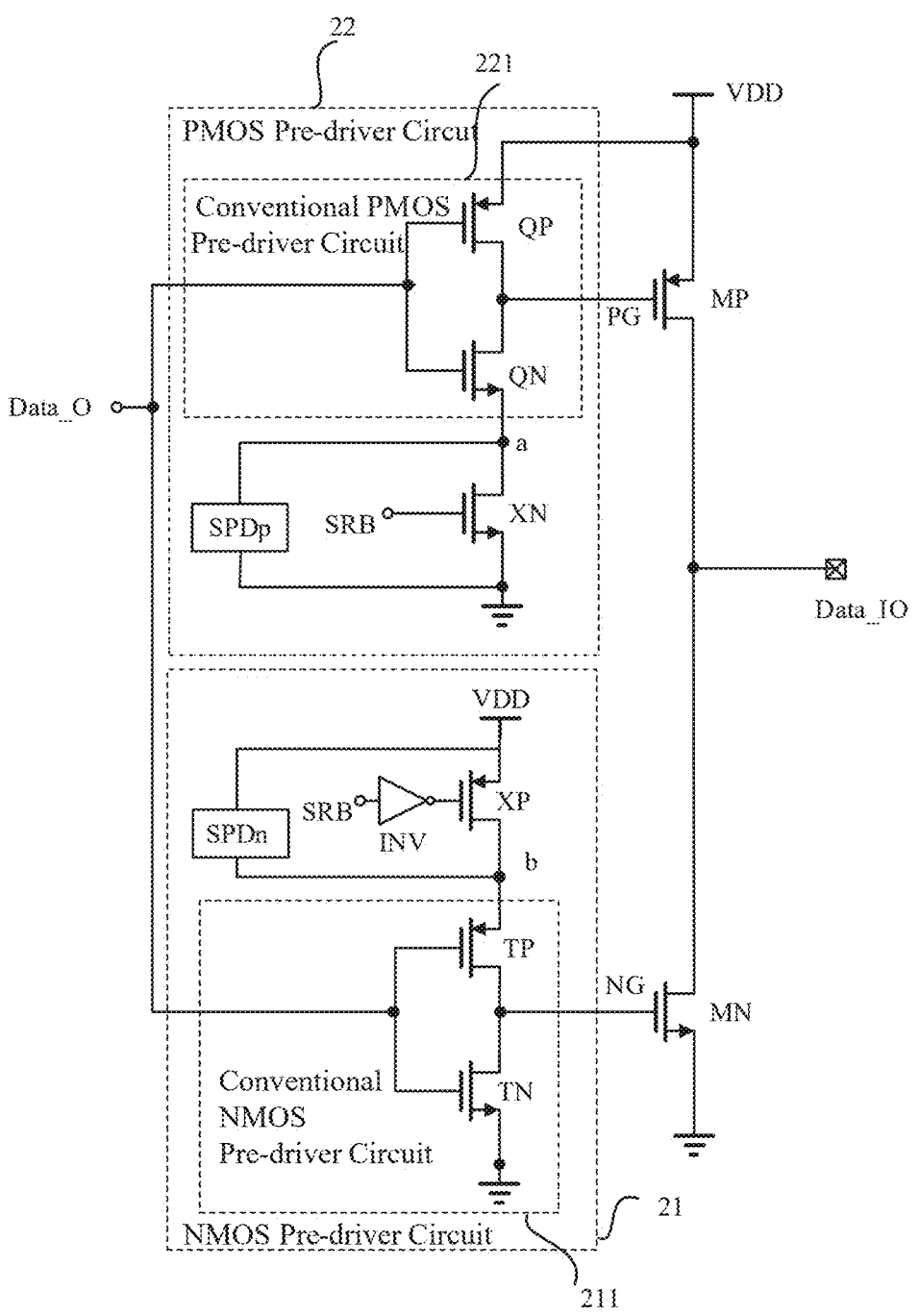
FIG. 6 is a schematic diagram showing the structure of another example of the GPIO circuit according to the first embodiment of the present invention.

Referring to FIGS. 5 and 6, in Embodiment 1 of the present invention, there is provided a GPIO circuit which includes an output driver branch including a pull-up output driver transistor MP (e.g., a PMOS transistor) and a pull-down output driver transistor MN (e.g., an NMOS transistor). Drains of the respective output driver transistors MP, MN are coupled to a single GPIO pin Data_IO. A gate of the output driver transistor MP is coupled to an output terminal PG of a PMOS pre-driver circuit 22, and a gate of the output driver transistor MN is coupled to an output terminal NG of an NMOS pre-driver circuit 21. Input terminals of the respective PMOS 22 and NMOS 21 pre-driver circuits are both coupled to a signal Data_O to be output. A corresponding drive signal is output from the output terminal PG of the PMOS pre-driver circuit 22 to the gate of the output driver transistor MP to separately control turn-on and turn-off of the output driver transistor MP. A corresponding drive signal is output from the output terminal NG of the NMOS pre-driver circuit 21 to the gate of the output driver transistor MN to separately control turn-on and turn-off of the output driver transistor MN.

The GPIO circuit is embedded in a chip (not shown), and the GPIO pin Data_IO is disposed outside the chip (note that, as used hereinafter, the phrases "inside the chip" and "outside the chip" mean "inside a die" and "outside the die", respectively). As an interface circuit of the chip, the GPIO circuit modifies the drive signals at the gates of the output driver transistor MP, MN using the PMOS and NMOS pre-driver circuits 22, 21 to alternately turn on and off the output driver transistors MP, MN to alternately pull a potential at the GPIO pin Data_IO up to a power supply voltage VDD or down to a ground voltage VSS. In this way, the internal signal Data_O is transmitted to the GPIO pin (or a pad) Data_IO outside the chip, while preventing the output driver transistors MP, MN from being turned on at the same time and thereby preventing a shoot-through current from the power supply voltage VDD through the output driver transistors MP, MN to the ground.

The GPIO circuit follows the "slow on, quick off" principle to turn on the output driver transistors MP, MN slowly and turn off them quickly under the control of the PMOS 22 and NMOS 21 pre-driver circuits. That is, under the control of the PMOS pre-driver circuit 22, the gate of the output driver transistor MP transitions slowly from a high level to a low level and quickly from the low level to the high level. Moreover, under the control of the NMOS pre-driver circuit 21, the gate of the output driver transistor MN transitions in an opposite manner. Thus, under the control of the PMOS 22 and NMOS 21 pre-driver circuits, the output driver transistor MN is turned off before the output driver transistor MP is turned on, or the output driver transistor MP is turned off before the output driver transistor MN is turned on. In this way, a shoot-through current from the power supply voltage VDD through the output driver transistors MP, MN to the ground is prevented.

In one example, referring to FIG. 5, the NMOS pre-driver circuit 21 is implemented as a conventional NMOS pre-driver circuit known in the art, and the PMOS pre-driver circuit 22 is obtained by adding a pre-driver transistor XN and a slow pre-driver (SPD) circuit SPDp to a conventional PMOS pre-driver circuit known in the art. A gate of the pre-driver transistor XN is controlled by a corresponding slope control signal SRB. The slope control signal SRB may be configured and controlled by software, or by a user-configured digital register.

Optionally, small overshoots or SSN in the output waveform (i.e., a gently sloped transient current) can be simply achieved by turning off the pre-driver transistor XN through configuring the slope control signal SRB at a certain value (e.g., 0). In case of a small capacitive load, a high-frequency output signal (i.e., a steeply sloped transient current) can be obtained by turning on the pre-driver transistor XN through configuring the slope control signal SRB at another value (e.g., 1) and thereby enabling the pre-driver circuit of the present application to operate almost in the same way as the conventional pre-driver circuit.

In this example, referring to FIG. 5, the PMOS pre-driver circuit 22 includes a conventional PMOS pre-driver circuit 221, a pre-driver transistor XN and an SPD circuit SPDp. The conventional PMOS pre-driver circuit 221 includes a pull-up driver transistor QP (e.g., a PMOS, PNP or other P-type transistor) and a pull-down driver transistor QN (e.g., an NMOS, NPN or other N-type transistor). A source of the pull-up driver transistor QP serves as a power supply input of the conventional PMOS pre-driver circuit 221 and is coupled to the power supply voltage VDD. A gate of the pull-up driver transistor QP is coupled to a gate of the pull-down driver transistor QN, and the two together serve as an input of the conventional PMOS pre-driver circuit 221, to which the signal Data_O to be output is coupled. As such, under the control of the signal Data_O to be output, an output terminal PG of the conventional PMOS pre-driver circuit 221 can be pulled up to the power supply voltage VDD or down to the ground voltage VSS, thereby controlling turn-on and turn-off of the output driver transistor MP coupled thereto. A drain of the pull-up driver transistor QP is coupled to a drain of the pull-down driver transistor QN, and the two together serve as the output terminal (node PG) of the conventional PMOS pre-driver circuit 221, to which the gate of the output driver transistor MP is coupled. A gate of the pre-driver transistor XN is coupled to the slope control signal SRB, and a drain of the pre-driver transistor XN is coupled to a source of the pull-down driver transistor QN (which often serves as a ground terminal of the conventional PMOS pre-driver circuit 221) at a node a. A source of the pre-driver transistor XN is grounded. The SPD circuit SPDp is coupled between the source and drain of the pre-driver transistor XN. Pull-down capability of QN is much weaker than pull-up capability of QP, the pull-down capability of the pre-driver transistor XN is much stronger than that of the SPD circuit SPDp. Therefore, in order to output a gently sloped transient current, the slope control signal SRB is configured (e.g., to be equal to 0) so that the pre-driver transistor XN is turned off. Under the action of the conventional PMOS pre-driver circuit 221 and the SPD circuit SPDp, which are both in an on-state, the output driver transistor MP can be turned on slowly and turned off quickly. That is, the output driver transistor MP follows the "slow on, quick off" principle, which can avoid the occurrence of a shoot-through current from the power supply voltage VDD through the output driver transistor MP to the ground.

Operation of the GPIO circuit in this example is as follows.

In case of a small off-chip capacitive load of the chip incorporating the GPIO circuit, if a high-frequency output signal is required in an on-state of MP, it is necessary to output a steeply sloped transient current. To this end, the slope control signal SRB is configured (e.g., to be equal to 1) so that the pre-driver transistor XN is turned on, and the SPD circuit SPDp is also turned on. At the same time, the conventional PMOS pre-driver circuit 221 is also turned on (e.g., under the control of Data_O=1). As a result, the output driver transistor MP is turned on in a normal mode, in which the PMOS pre-driver circuit 22 operates almost in the same way as the PMOS pre-driver circuit of FIG. 1.

If a gently sloped output transient current is required in an on-state of MP, the slope control signal SRB is configured (e.g., to be equal to 0) so that the pre-driver transistor XN is turned off, and the SPD circuit SPDp is turned on. At the same time, the conventional PMOS pre-driver circuit 221 is also turned on under the control of the signal Data_O to be output (e.g., QN is turned on under the control of Data_O=1, pulling down PG). As a result, the gate of the output driver transistor MP is pulled down very slowly, slowing down the turn-on of the output driver transistor MP and thus resulting in a less steeply sloped output transient current. That is, the output driver transistor MP is turned on in a slope-controlled mode, in which it is turned on more slowly than in the conventional normal mode.

In order to turn off MP, under the control of Data_O=0, a signal is output from the output terminal PG of the conventional PMOS pre-driver circuit 221 and turns off MP.

In another example, referring to FIG. 6, the PMOS pre-driver circuit 22 is obtained by adding a pre-driver transistor XN and an SPD circuit SPDp to a conventional PMOS pre-driver circuit known in the art, and the NMOS pre-driver circuit 21 is obtained by adding a pre-driver transistor XP and an SPD circuit SPDn to a conventional NMOS pre-driver circuit known in the art. Moreover, the NMOS pre-driver circuit 21 is a dual version of the PMOS pre-driver circuit 22.

In this example, referring to FIG. 6, the PMOS pre-driver circuit 22 includes a conventional PMOS pre-driver circuit 221, a pre-driver transistor XN and an SPD circuit SPDp. The conventional PMOS pre-driver circuit 221 includes a pull-up driver transistor (e.g., a PMOS, PNP or other P-type transistor) and a pull-down driver transistor QN (e.g., an NMOS, NPN or other N-type transistor). A source of the pull-up driver transistor QP serves as a power supply input terminal of the conventional PMOS pre-driver circuit 221 and is coupled to the power supply voltage VDD. A gate of the pull-up driver transistor QP is coupled to a gate of the pull-down driver transistor QN, and the two together serve as an input terminal of the conventional PMOS pre-driver circuit 221, to which the signal Data_O to be output is coupled. As such, under the control of the signal Data_O to be output, an output terminal PG of the conventional PMOS pre-driver circuit 221 can be pulled up to the power supply voltage VDD or down to the ground voltage VSS, thereby controlling turn-on and turn-off of the output driver transistor MP coupled thereto. A drain of the pull-up driver transistor QP is coupled to a drain of the pull-down driver transistor QN, and the two together serve as the output terminal (node PG) of the conventional PMOS pre-driver circuit 221, to which the gate of the output driver transistor MP is coupled. A gate of the pre-driver transistor XN is coupled to the slope control signal SRB, and a drain of the pre-driver transistor XN is coupled to a source of the pull-down driver transistor QN (which often serves as a ground terminal of the conventional PMOS pre-driver circuit 221) at a node a. A source of the pre-driver transistor XN is grounded. The SPD circuit SPDp is coupled between the source and drain of the pre-driver transistor XN. Pull-down capability of QN is much weaker than pull-up capability of QP, and pull-down capability of the pre-driver transistor XN is much stronger than that of the SPD circuit SPDp. Therefore, in order to output a gently sloped transient current, the slope control signal SRB is configured (e.g., to be equal to 0) so that the pre-driver transistor XN is turned off. In this way, the output driver transistor MP can be turned on slowly and turned off quickly. That is, the output driver transistor MP follows the "slow on, quick off" principle, which can avoid the occurrence of a shoot-through current from the power supply voltage VDD through the output driver transistor MP to the ground.

In this example, with continued reference to FIG. 6, the NMOS pre-driver circuit 21 includes a conventional NMOS pre-driver circuit 211, a pre-driver transistor XP and an SPD circuit SPDn. The conventional NMOS pre-driver circuit 211 includes a pull-up driver transistor TP (e.g., a PMOS, PNP or other P-type transistor) and a pull-down driver transistor TN (e.g., an NMOS, NPN or other N-type transistor). A gate of the pull-up driver transistor TP is coupled to a gate of the pull-down driver transistor TN, and the two together serve as an input terminal of the conventional NMOS pre-driver circuit 211, to which the signal Data_O to be output is coupled. As such, under the control of the signal Data_O to be output, an output terminal NG of the conventional NMOS pre-driver circuit 221 can be pulled up to the power supply voltage VDD or down to the ground voltage VSS, thereby controlling turn-on and turn-off of the output driver transistor MN coupled thereto. A drain of the pull-up driver transistor TP is coupled to a drain of the pull-down driver transistor TN, and the two together serve as the output terminal (node NG) of the conventional NMOS pre-driver circuit 221, to which the gate of the output driver transistor MN is coupled. A gate of the pre-driver transistor XP is coupled to an output terminal of an inverter INV, and the slope control signal SRB is received at an input terminal of the inverter INV. A drain of the pre-driver transistor XP is coupled to a source of the pull-up driver transistor TP (which often serves as a power supply input of the conventional NMOS pre-driver circuit 221) at a node b, and a source of the pre-driver transistor XP is coupled to the power supply voltage VDD. A source of the pull-down driver transistor TN is grounded (i.e., it serves as a ground terminal of the conventional NMOS pre-driver circuit 221). The SPD circuit SPDn is coupled between the source and the drain of the pre-driver transistor XP. Pull-down capability of TN is much stronger than pull-up capability of TP, and pull-up capability of the pre-driver transistor XP is much stronger than that of the SPD circuit SPDn. Therefore, in order to output a gently sloped transient current, the slope control signal SRB is configured (e.g., to be equal to 0) so that the pre-driver transistor XP is turned off. In this way, the output driver transistor MN can be turned on slowly and turned off quickly. That is, the output driver transistor MN follows the "slow on, quick off" principle, which can avoid the occurrence of a shoot-through current from the power supply voltage VDD through the output driver transistor MN to the ground. More specifically, when the SPD circuit SPDn is turned on and the conventional NMOS pre-driver circuit 211 is also turned on under the control of the signal Data_O to be output (e.g., TP is turned on under the control of Data_O=0, pulling up NG), the gate NG of the output driver transistor MN is pulled up very slowly, slowing down the turn-on of the output driver transistor MN and thus resulting in a less steeply sloped output transient current. That is, the output driver transistor MN is turned on in a slope-controlled mode, in which it is turned on more slowly than in the conventional normal mode.

In this example, the gates of the pre-driver transistors XN, XP are directly or indirectly controlled by the slope control signal SRB. The slope control signal SRB may be configured or controlled by software, or by a user-configured digital register.

With combined reference to FIG. 10, operation of the GPIO circuit in this example is as follows.

In order to output a steeply sloped transient current when MP is turned on and MN is turned off, SRB is configured to be 1, the pre-driver transistor XN is turned on, and the SPD circuit SPDp is also turned on. Under the control of Data_O=1, the output terminal PG of the conventional PMOS pre-driver circuit 221 is pulled down to the ground voltage VSS. At the same time, the pre-driver transistor XP is turned on, and under the control of Data_O=1, the output terminal NG of the conventional NMOS pre-driver circuit 211 is also pulled down to the ground voltage VSS. As a result, the output driver transistor MN is turned off in the normal mode, and the output driver transistor MP is turned on in the normal mode. In this process, turning on the pre-driver transistor XN is functionally equivalent to shorting the SPD circuit SPDp so that the PMOS pre-driver circuit 22 operates almost in the same manner as the PMOS pre-driver circuit of FIG. 1.

In order to output a gently sloped transient current when MP is turned on and MN is turned off, SRB is configured to be 0, the pre-driver transistor XN is turned off, and the SPD circuit SPDp is turned on. Under the control of Data_O=1, the output terminal PG of the conventional PMOS pre-driver circuit 221 is pulled down to the ground voltage VSS. At the same time, the pre-driver transistor XP is turned off, and under the control of Data_O=1, the output terminal NG of the conventional NMOS pre-driver circuit 211 is also pulled down to the ground voltage VSS. As a result, the output driver transistor MN is turned off, and the gate of the output driver transistor MP is pulled down very slowly under the action of the SPD circuit SPDp, slowing down the turn-on of the output driver transistor MP and thus resulting in a less steeply sloped output transient current. That is, the output driver transistor MP is turned on in a slope-controlled mode, in which the output driver transistor MP is turned on more slowly than in the conventional normal mode.

In order to output a steeply sloped transient current when MP is turned off and MN is turned on, SRB is configured to be 1, the pre-driver transistor XP is turned on and the SPD circuit SPDn is also turned on. Under the control of Data_O=0, the output terminal NG of the conventional NMOS pre-driver circuit 211 is pulled up to the power supply voltage VDD. At the same time, the pre-driver transistor XN is turned on, and under the control of Data_O=0, the output terminal PG of the conventional PMOS pre-driver circuit 221 is also pulled up to the power supply voltage VDD. As a result, MP is turned off, and the output driver transistor MN is turned on in the normal mode. In this process, turning on the pre-driver transistor XP is functionally equivalent to shorting the SPD circuit SPDp so that the NMOS pre-driver circuit 21 operates almost in the same manner as the NMOS pre-driver circuit of FIG. 1.

In order to output a gently sloped transient current when MP is turned off and MN is turned on, SRB is configured to be 0, the pre-driver transistor XP is turned off and the SPD circuit SPDn is turned on. Under the control of Data_O=0, the output terminal NG of the conventional NMOS pre-driver circuit 211 is pulled up to the power supply voltage VDD. At the same time, the pre-driver transistor XN is also turned off, and under the control of Data_O=0, the output terminal PG of the conventional PMOS pre-driver circuit 221 is pulled up to the power supply voltage VDD. As a result, MP is turned off, and the gate NG of the output driver transistor MN is pulled up very slowly under the action of the SPD circuit SPDp, slowing down the turn-on of the output driver transistor MN and thus resulting in a less steeply sloped output transient current. That is, the output driver transistor MN is turned on in a slope-controlled mode, in which the output driver transistor MN is turned on more slowly than in the conventional normal mode.

To sum up, when the electrical level received at the gate of the output driver transistor MP or MN transitions to the "turn-on level" of the output driver transistor MP or MN (i.e., when the pre-driver transistor XN or XP is turned off under the control of the signal SRB), the output driver transistor MP or MN is turned on slowly. On the contrary, when the electrical level transitions to the "turn-off level" of the output driver transistor MP or MN (i.e., when the pre-driver transistor XN or XP is turned on under the control of the signal SRB), the output driver transistor MP or MN is turned off quickly. In this way, it is ensured that the output driver transistor MN is turned off before the output driver transistor MP is turned on, or that the output driver transistor MP is turned off before the output driver transistor MN is turned on. This prevents the occurrence of a shoot-through current from the power supply voltage VDD through the output driver transistor MN or MP to the ground.

It would be appreciated that, in both the above examples, the GPIO circuit may employ a push-pull output mode or an open-drain output mode. In the push-pull output mode, the drive signals output from the PMOS and NMOS pre-driver circuits 22, 21 may be complementary signals which alternately turn on and off the output driver transistors MP, MN so that one of them is in an on-state and the other is in an off-state at any time. In this way, they alternately provide high and low levels to the GPIO pin Data_IO, thereby transmitting the signal Data_O to be output to the GPIO pin Data_IO. In the open-drain output mode, the PMOS pre-driver circuit 22 may always keep the output driver transistor MP in an off-state, while the NMOS pre-driver circuit 21 may turn on or off the output driver transistor MN. Moreover, the signal Data_O may be transmitted to the GPIO pin Data_IO when the output driver transistor MN is turned on by the NMOS pre-driver circuit 21.

Further, although a structure of an output part of the GPIO circuit for transmitting the internal signal Data_O to the GPIO pin Data_IO outside the chip has been primarily discussed above in the foregoing examples, the present invention is not so limited, because the GPIO circuit may also include an input part (not shown) coupled to the GPIO pin Data_IO. This input part may be configured mainly to transmit an external signal received at the GPIO pin Data_IO into the chip.

It would be also appreciated that the SPD circuits SPDp, SPDn in the foregoing examples may be implemented as any suitable electronic elements or circuits. Optionally, the SPD circuits SPDp, SPDn may be each constructed, for example, simply from an MOS transistor, or from an MOS transistor and a resistor, or from an MOS transistor and a reference current source. In this way, the SPD circuits may have a simple design, and the gates of the output driver transistors can be pulled down even more slowly through properly configuring a parameter of the SPD circuits (e.g., width-to-length ratio of the MOS transistor, resistance of the resistor, or magnitude of a reference current provided by the reference current source). In any case, a gate of the MOS transistor in the SPD circuit SPDp that corresponds to the pull-up output driver transistor MP is coupled to the power supply voltage VDD, and a gate of the MOS transistor in the SPD circuit SPDn that corresponds to the pull-down output driver transistor MN is coupled to the ground voltage VSS.

In one example, as shown in FIG. 7A, the SPD circuit SPDp is constructed from an NMOS transistor SN with a width-to-length ratio that is much smaller than one (i.e., W/L<<1). A drain of the NMOS transistor SN is coupled to the node a, and a source thereof is grounded. A gate of the NMOS transistor SN is coupled to the power supply voltage VDD. As shown in FIG. 7B, the SPD circuit SPDn is constructed from a PMOS transistor SP with a width-to-length ratio that is much smaller than one (i.e., W/L<<1). A drain of the PMOS transistor SP is coupled to the node b, and a source thereof is coupled to the power supply voltage VDD. A gate of the PMOS transistor SP is coupled to the ground voltage VSS. In another example, as shown in FIG. 8A, the SPD circuit SPDp is constructed from a conventional NMOS transistor SN and a resistor R0. The conventional NMOS transistor SN has a width-to-length ratio that is not much smaller than 1. A drain of the conventional NMOS transistor SN is connected in series with one terminal of the resistor R0, and the other terminal of the resistor R0 is coupled to the node a. A source of the conventional NMOS transistor SN is grounded. With this arrangement, the gate of the corresponding pull-up output driver transistor MP can also be pulled down more slowly. As shown in FIG. 8B, the SPD circuit SPDn is constructed from a conventional PMOS transistor SP and a resistor R1. The conventional PMOS transistor SP has a width-to-length ratio that is not much smaller than 1. A drain of the conventional PMOS transistor SP is connected in series with one terminal of the resistor R1, and the other terminal of the resistor R1 is coupled to the node b. A source of the conventional PMOS transistor SP is coupled to the power supply voltage VDD. With this arrangement, the gate of the corresponding pull-down output driver transistor MN can also be pulled up more slowly.

In yet another example, as shown in FIG. 9A, the SPD circuit SPDp is constructed from a reference current source IREF and a current mirror. The current mirror includes transistors SNR and SN (which are both NMOS transistors). A drain of the transistor SNR is coupled to a gate of the transistor SNR, a gate of the transistor SN and a terminal of the reference current source IREF. Sources of the respective transistors SNR and SN are both grounded. A drain of the transistor SN is coupled to the node a. SN copies a current flowing through the reference current source IREF and thereby pulls down the node PG. The node PG can be pulled down more slowly through properly configuring the magnitude of the current flowing through the reference current source IREF. As shown in FIG. 9B, the SPD circuit SPDn is constructed from a reference current source IREF and a current mirror. The current mirror includes transistors SPR and SP (which are both PMOS transistors). A drain of the transistor SPR is coupled to a gate of the transistor SPR, a gate of the transistor SP and a terminal of the reference current source IREF_1. A source of the transistor SPR is coupled to the power supply voltage VDD. A source of the transistor SP is coupled to the power supply voltage VDD, and a drain of the transistor SP is coupled to the node b. Another terminal of the reference current source IREF_1 is grounded. The transistor SP copies a current flowing through the reference current source IREF and thereby pulls up the node NG. The node NG can be pulled up more slowly through properly configuring the magnitude of the current flowing through the reference current source IREF.

As noted above, an SPD circuit and a pre-driver transistor are added, in accordance with Embodiment 1. In order to output a steeply sloped transient current, the SPD circuit is turned on, and a slope control signal SRB is so configured that the pre-driver transistor is turned on. Under the control of a signal Data_O to be output, a conventional pre-driver circuit is turned on, thus allowing an output driver transistor to be turned on in a normal mode (and the GPIO circuit thus operates in the normal mode). On the contrary, in order to output a gently sloped transient current, the SPD circuit is turned on, and the slope control signal SRB is configured so that the pre-driver transistor is turned off. Under the control of the signal Data_O to be output, the conventional pre-driver circuit is turned on, allowing the output driver transistor to be turned on in a slope-controlled mode (and the GPIO circuit thus operates in the slope-controlled mode), in which the output driver transistor is turned on more slowly than in the normal mode. This allows the GPIO circuit to be used flexibly and better meet the requirements of various applications.

Embodiment 2

Figure 11:
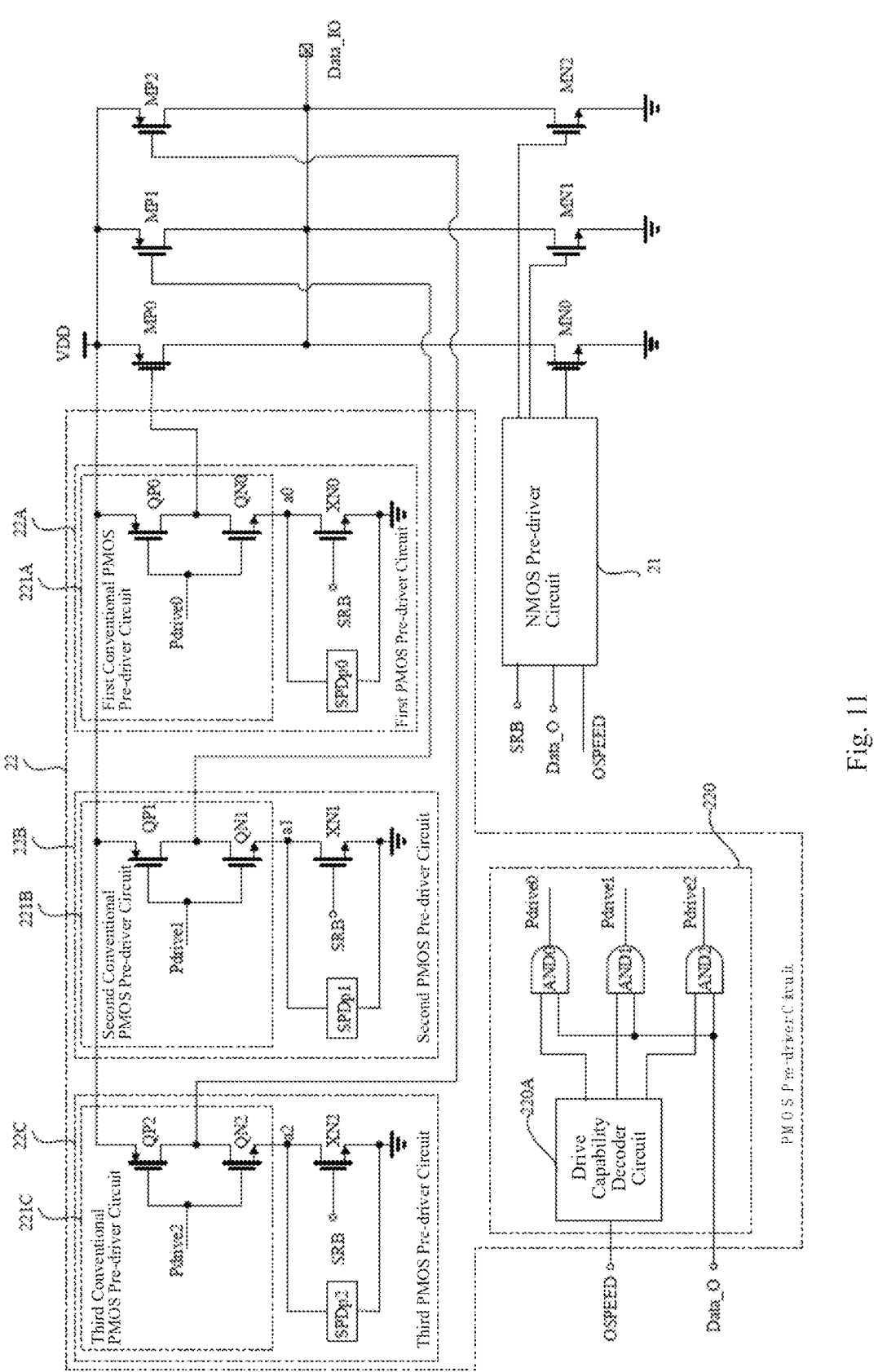
FIG. 11 is a schematic diagram showing the structure of a GPIO circuit according to a second embodiment of the present invention.

Referring to FIG. 11, in Embodiment 2, there is provided a GPIO circuit, which differs from the GPIO circuit of the Embodiment 1 in that: the GPIO circuit of Embodiment 2 may be turned on group-wise. The GPIO circuit of Embodiment 2 includes n output driver branches (n is an integer greater than 1). Each output driver branch includes a pull-up output driver transistor MP (e.g., a PMOS transistor) and a pull-down output driver transistor MN (e.g., an NMOS transistor). The connection nodes of the pull-up and pull-down output driver transistors MP, MN in the output driver branches are all coupled to a GPIO pin Data_IO. In each output driver branch i (i=1 to n), the pull-up output driver transistor MPi–1 is coupled to an i-th PMOS pre-driver circuit, and the pull-down output driver transistor MNi–1 is coupled to an i-th NMOS pre-driver circuit. At least one of the first to n-th PMOS pre-driver circuits and first to n-th NMOS pre-driver circuits is implemented as a pre-driver circuit according to Embodiment 1, which is obtained by adding a pre-driver transistor, an SPD circuit and a selection control circuit to a conventional pre-driver circuit known in the art.

The selection control circuit is based on a signal Data_O to be output and a selection control signal OSPEED to provide a drive signal to the corresponding pre-driver circuit and thereby selectively turn on some or all of the n output driver branches. When the selection control circuit turns on some of the n output driver branches, small overshoots can be achieved in the output waveform. When the selection control circuit turns on all the n output driver branches, a high-frequency output signal can be obtained. In this way, a peak value $I_P$ of an output transient current can be reduced by turning on fewer output driver transistors, thereby reducing simultaneous switching noise (SSN).

Optionally, the selection control circuit 220 in the PMOS pre-driver circuit 22 may include a drive capability decoder circuit 220A and n AND logic circuits AND0 to ANDn (not shown). Output terminals of the respective AND logic circuits are coupled to the first to n-th PMOS pre-driver circuits and configured to provide the first to n-th PMOS pre-driver circuits with respective drive signals Pdrive0 to Pdriven (not shown). An input terminal of the drive power decoder circuit 220A is coupled to the selection control signal OSPEED. An input terminal of each AND logic circuit AND0 to ANDn is coupled to a corresponding output of the drive capability decoder circuit 220A, and another input terminal of each AND logic circuit AND0 to ANDn is coupled to the signal Data_O to be output. In this way, based on the signal Data_O to be output and the selection control signal OSPEED, the drive capability decoder circuit 220A and the AND logic circuits AND0 to ANDn can generate the drive signals Pdrive0 to Pdriven required by the first to n-th PMOS pre-driver circuits to selectively turn on some or all of the n output driver branches.

Optionally, the first PMOS pre-driver circuit may be obtained by adding a pre-driver transistor XN0 and an SPD circuit SPDp0, the second PMOS pre-driver circuit by adding a pre-driver transistor XN1 and an SPD circuit SPDp1, . . . , and the n-th PMOS pre-driver circuit by adding a pre-driver transistor XNn−1 and an SPD circuit SPDpn−1. In this case, a ratio of width-to-length ratios of MP0 to MPn−1 is equal to a pull-down capability ratio of the respective SPD circuits SPDp0 to SPDpn−1.

Optionally, the first NMOS pre-driver circuit may be obtained by adding a pre-driver transistor XP0 (not shown) and an SPD circuit SPDn0 (not shown), the second NMOS pre-driver circuit by adding a pre-driver transistor XP1 (not shown) and a SPD circuit $SPD_n1$ (not shown), . . . , and the n-th NMOS pre-driver circuit by adding a pre-driver transistor XPn−1 (not shown) and an SPD circuit $SPD_n n−1$ (not shown). In this case, a ratio of width-to-length ratios of MN0 to MNn−1 is equal to a pull-up capability ratio of the respective SPD circuits $SPD_n 0$ to $SPD_n n−1$. This enables the n output driver branches to be turned on at the same rate, thus reducing simultaneous switching noise (SSN).

In one example, as shown in FIG. 11, n=3. That is, the GPIO circuit includes three output driver branches, and a PMOS pre-driver circuit 22 and a NMOS pre-driver circuits 21 that are both coupled to the three output driver branches. The first output driver branch includes output driver transistors MP0 and MN0, the second output driver branch includes output driver transistors MP1 and MN1, and the third output driver branch includes output driver transistors MP2 and MN2. Drains of the output driver transistors MP0 to MP2 and MN0 to MN2 are all coupled to the GPIO pin Data_IO. Sources of the output driver transistors MP0 to MP2 are all coupled to a power supply voltage VDD, and sources of the output driver transistors MN0 to MN2 are all grounded. The PMOS pre-driver circuit 22 includes a selection control circuit 220, a first PMOS pre-driver circuit 22A, a second PMOS pre-driver circuit 22B and a third PMOS pre-driver circuit 22C. The selection control circuit 220 is based on the signal Data_O to be output and the selection control signal OSPEED to generate drive signals Pdrive0 to Pdrive2 and provides them respectively to the first PMOS pre-driver circuit 22A, the second PMOS pre-driver circuit 22B and the third PMOS pre-driver circuit 22C.

The first PMOS pre-driver circuit 22A includes a first conventional PMOS pre-driver circuit 221A, a pre-driver transistor XN0 and an SPD circuit SPDp0. Optionally, the first conventional PMOS pre-driver circuit 221A may include a pull-up driver transistor QP0 and a pull-down driver transistor QN0. Gates of the pull-up driver transistor QP0 and the pull-down driver transistor QN0 are coupled to the drive signal Pdrive0. Drains of the pull-up driver transistor QP0 and the pull-down driver transistor QN0 are coupled to a gate of the output driver transistor MP0. A drain of the pre-driver transistor XN0 is coupled to a source of the pull-down driver transistor QN0. A source of the pre-driver transistor XN0 is grounded. A gate of the pre-driver transistor XN0 is coupled to a slope control signal SRB. Pull-down capability of the pre-driver transistor XN0 is much stronger than pull-down capability of SPDp0, and pull-down capability of the pull-down driver transistor QN0 should be weaker than pull-up capability of the pull-up driver transistor QP0.

The second PMOS pre-driver circuit 22B includes a second conventional PMOS pre-driver circuit 221B, a pre-driver transistor XN1 and an SPD circuit SPDp1. Optionally, the second conventional PMOS pre-driver circuit 221B may include a pull-up driver transistor QP1 and a pull-down driver transistor QN1. Gates of the pull-up driver transistor QP1 and the pull-down driver transistor QN1 are coupled to the drive signal Pdrive1. Drains of the pull-up driver transistor QP1 and the pull-down driver transistor QN1 are coupled to a gate of the output driver transistor MP1. A drain of the pre-driver transistor XN1 is coupled to a source of the pull-down driver transistor QN1. A source of the pre-driver transistor XN1 is grounded. A gate of the pre-driver transistor XN1 is coupled to the slope control signal SRB. Pull-down capability of the pre-driver transistor XN1 is much stronger than pull-down capability of SPDp1, and pull-down capability of the pull-down driver transistor QN1 should be weaker than pull-up capability of the pull-up driver transistor QP1.

The third PMOS pre-driver circuit 22C includes a third conventional PMOS pre-driver circuit 221C, a pre-driver transistor XN2 and an SPD circuit SPDp2. Optionally, the third conventional PMOS pre-driver circuit 221C may include a pull-up driver transistor QP2 and a pull-down driver transistor QN2. Gates of the pull-up driver transistor QP2 and the pull-down driver transistor QN2 are coupled to the drive signal Pdrive2. Drains of the pull-up driver transistor QP2 and the pull-down driver transistor QN2 are coupled to a gate of the output driver transistor MP2. A drain of the pre-driver transistor XN2 is coupled to a source of the pull-down driver transistor QN2. A source of the pre-driver transistor XN2 is grounded. A gate of the pre-driver transistor XN2 is coupled to the slope control signal SRB. Pull-down capability of the pre-driver transistor XN2 is much stronger than pull-down capability of SPDp2, and pull-down capability of the pull-down driver transistor QN2 should be weaker than pull-up capability of the pull-up driver transistor QP2.

Width-to-length ratios of MP0, MP1 and MP2 increase sequentially, and in order to enable MP0, MP1 and MP2 to be turned on at the same rate, pull-down capability of SPDp0 to SPDp2 (corresponding to the sizes of the MOS transistors in SPDp0 to SPDp2) increase sequentially as well. As an example, the width-to-length ratios of the MP0, MP1 and MP2 are at a ratio of 1:2:4, and a pull-down capability ratio of SPDp0, SPDp1 and SPDp2 is also 1:2:4.

The selection control circuit 220 includes a drive capability decoder circuit 220A and three AND logic circuits AND0 to AND2. The drive capability decoder circuit 220A may be a multiplexer with a single input and multiple outputs. The input is coupled to the selection control signal OSPEED, and one input of each of the AND logic circuits AND0 to AND2 is coupled to a corresponding output of the drive power decoder circuit 220A. Each of the AND logic circuits AND0 to AND2 has another input coupled to the signal Data_O to be output. An output of the AND logic circuit AND0 is coupled to the gates of QP0 and QN0 in the first PMOS pre-driver circuit 22A and provides the drive signal Pdrive0 to the first PMOS pre-driver circuit 22A. An output of the AND logic circuit AND1 is coupled to gates of QP1 and QN1 in the second PMOS pre-driver circuit 22B and provides the drive signal Pdrive1 to the second PMOS pre-driver circuit 22B. An output of the AND logic circuit AND2 is coupled to gates of QP2 and QN2 in the third PMOS pre-driver circuit 22C and provides the drive signal Pdrive2 to the third PMOS pre-driver circuit 22C.

Operation of the GPIO circuit in Embodiment 2 is as follows. The selection control circuit 220 is based on the signal Data_O to be output and the selection control signal OSPEED to provide the drive signals Pdrive0 to Pdrive2 respectively to the first PMOS pre-driver circuit 22A, the second PMOS pre-driver circuit 22B and the third PMOS pre-driver circuit 22C, and thereby selectively turn on one, two or all of the three output driver branches. In order to achieve small overshoots in the output waveform (i.e., a gently sloped transient current i(t)), only the first output driver branch including the output driver transistors MP0 and MN0 may be turned on under the control of Pdrive0 to Pdrive2. Moreover, the pre-driver transistor XN0 in the first PMOS pre-driver circuit 22A is turned off under the control of SRB, SPD0 is turned on, as a result, the output driver transistor MP0 is turned on more slowly, resulting in an output transient current with a smaller slope than that in Embodiment 1. In order to output a high-frequency signal, SPD0 to SPD2 may be all turned on, and the three output driver branches may also be all turned on under the control of Pdrive0 to Pdrive2. In addition, XN0 to XN2 may be turned on under the control of SRB. In this way, the output driver transistors MP0 to MP2 may be turned on quickly, resulting in a steeply sloped output transient current.

It would be appreciated that in other examples of Embodiment 2, depending on the requirements of practical applications (e.g., reduced overshoots or SSN in the output waveform), SPDp1 to SPDp2 and XN1 to XN2 as described in the above examples may be omitted. That is, the first PMOS pre-driver circuit 22A may be obtained by adding only a pre-driver transistor and an SPD circuit. Alternatively, SPDp2 and XN2 as described in the above examples may be omitted. That is, each of the first PMOS pre-driver circuit 22A and the second PMOS pre-driver circuit 22B may be obtained by adding only a pre-driver transistor and an SPD circuit.

Optionally, the NMOS pre-driver circuit 21 may include a first NMOS pre-driver circuit (not shown) coupled to the gate of MN0, a second NMOS pre-driver circuit (not shown) coupled to the gate of MN1 and a third NMOS pre-driver circuit (not shown) coupled to the gate of MN2. It may further include another selection control circuit (not shown) coupled to each of the first, second and third NMOS pre-driver circuits. The first NMOS pre-driver circuit may be a dual version of the first PMOS pre-driver circuit 22A. The second NMOS pre-driver circuit may be a dual version of the second PMOS pre-driver circuit 22B. The third NMOS pre-driver circuit may be a dual version of the third PMOS pre-driver circuit 22C. Reference can be made to FIGS. 6 to 9B for more structural details of the first to third NMOS pre-driver circuits, and further description thereof is omitted herein. With this arrangement, the gates of the pull-up output driver transistors MP0 to MP2 and the pull-down output driver transistors MN0 to MN1 can be separately controlled. Moreover, when the pull-up and pull-down output driver transistors in the output branches all operate normally and are alternately turned on and off, each pull-down output driver transistor is turned off before the respective pull-up output driver transistor is turned on, or each pull-up output driver transistor is turned off before the respective pull-down output driver transistor is turned on. This can prevent a shoot-through current from the power supply voltage VDD through the pull-up and pull-down output driver transistors in any of the output driver branches to the ground.

It would be appreciated that, in Embodiment 2, the gates of the MOS transistors in the SPD circuits SPDp that correspond to the respective pull-up output driver transistors MP in the output driver branches are all coupled to the power supply voltage VDD, and the gates of the MOS transistors in the SPD circuits SPDn that correspond to the respective pull-down output driver transistors MN are all coupled to the ground voltage VSS.

Compared with the GPIO circuit of the Embodiment 1, reduced overshoots in the output waveform or reduced SSN can be achieved in Embodiment 2 by generating an output current with a lower peak value $I_P$ through turning on fewer n output driver branches (i.e., a smaller number of output driver transistors). Moreover, the pull-up and pull-down output driver transistors in the output driver branches can be separately turned on and off under the control of the respective pre-driver circuits. In this way, each output driver branch may operate either in a push-pull output mode, or in an open-drain output mode. This allows the GPIO circuit to be used flexibly and better meet the requirements of various applications.

Embodiment 3

Figure 12:
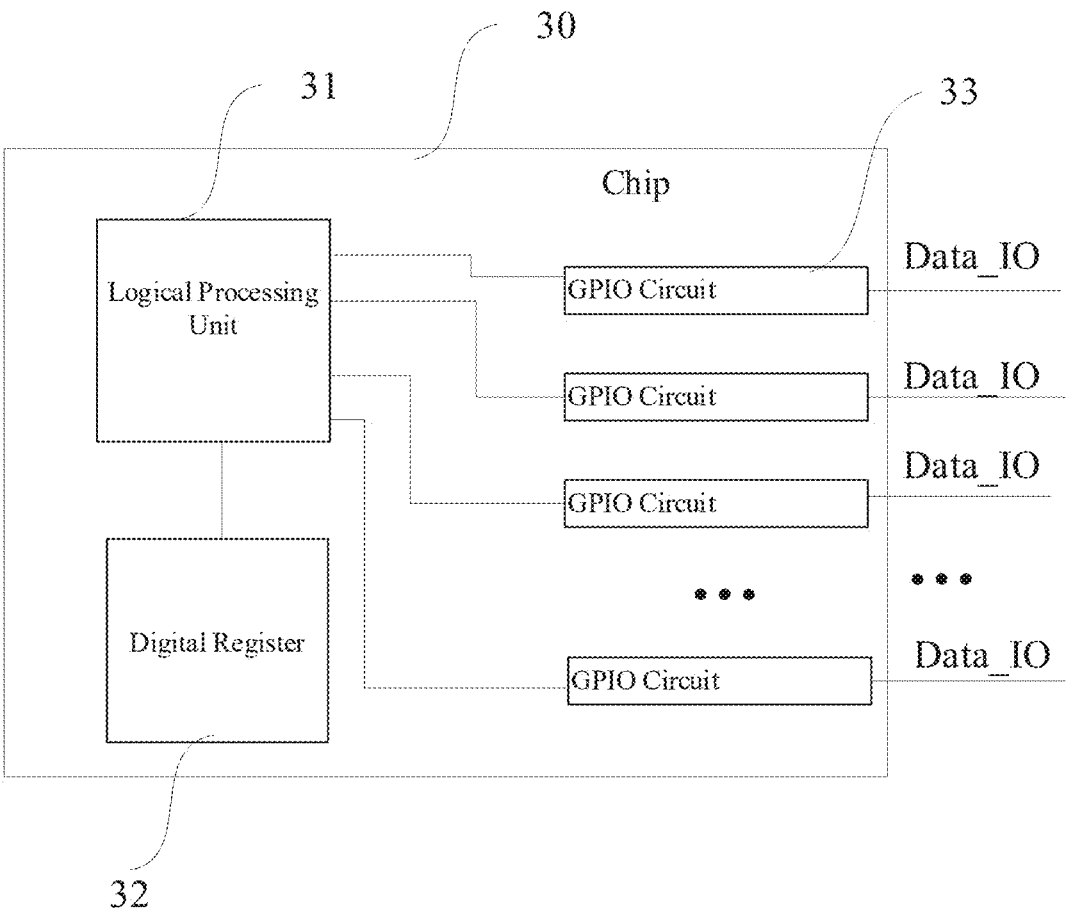
FIG. 12 is a schematic diagram showing the structure of a chip according to a third embodiment of the present invention.

Referring to FIG. 12, in Embodiment 3, there is provided a chip 30 including a logical processing unit 31, at least one general-purpose input/output (GPIO) pin Data_IO and GPIO circuit(s) 33 coupled to the logical processing unit 31 and the respective GPIO pin(s) Data_IO. Some or all of the GPIO circuit(s) 33 coupled to the GPIO pin(s) Data_IO may be implemented as a GPIO circuit according to any of the foregoing embodiments of the present invention. This can enhance reliability in transmission of signals out of and into the chip and prevent logic errors in signal transmission.

Optionally, the chip 30 may allow a plurality of GPIO circuits 33 coupled to respective GPIO pins Data_IO to be turned on or off under the control of a single slope control signal SRB. This enables multiple GPIO pins Data_IO in the chip to simultaneously output or receive signals within a short time interval.

Optionally, the chip 30 may further include a digital register 32, and the GPIO circuit(s) 33 coupled to the respective GPIO pin(s) Data_IO in the chip 30 may be divided into m groups, each provided with the same slope control signal SRB. The slope control signal SRB required by the respective groups is stored sequentially in the digital register 32. Therefore, users can configure the values of the slope control signal SRB required by each group by configuring the digital register 32, thereby turning off or turning on the corresponding pre-driver transistor. This achieves easy implementation.

Compared with the prior art, a simple, flexibly configurable structure can be obtained in accordance with the present invention by adding the SPD circuit and the pre-driver transistor. In order to output a signal, the SPD circuit is turned on, and the conventional pre-driver circuit is turned on under the control of the signal to be output. Moreover, the slope control signal is so configured that the pre-driver transistor is turned on or off. In this way, the output driver transistor can be turned on in the normal mode (and the GPIO circuit thus operates in the normal mode), or in the slope-controlled mode (and the GPIO circuit thus operates in the slope-controlled mode). In the slope-controlled mode, the output driver transistor is turned on more slowly than in the normal mode. This allows the GPIO circuit to be used flexibly and better meet the requirements of various applications (i.e., to have a wide scope of application).

Optionally, in the slope-controlled mode, the output driver transistor may drive a transient current output from the GPIO pin with a slope that is gentler than a slope of a transient current output in the normal mode, resulting in reduced simultaneous switching noise (SSN).

Optionally, when a corresponding output driver transistor is configured for pulling up, the drain of the pre-driver transistor may be coupled to a ground terminal of the conventional pre-driver circuit, the source of the pre-driver transistor may be grounded, and pull-down capability of the pre-driver transistor may be stronger than pull-down capability of the SPD circuit. Additionally, when a corresponding output driver transistor is configured for pulling down, the source of the pre-driver transistor may be coupled to a power supply voltage, the drain of the pre-driver transistor may be coupled to a power supply input of the conventional pre-driver circuit, and pull-up capability of the pre-driver transistor may be stronger than pull-up capability of the SPD circuit. With this arrangement, the output driver transistor can follow the "slow on, quick off" principle, which can prevent the occurrence of a shoot-through current from the power supply voltage VDD through the output driver transistor to the ground.

Optionally, the conventional pre-driver circuit may comprise a pull-up driver transistor and a pull-down driver transistor, gates of each pull-up and pull-down driver transistors coupled to the signal to be output, a drain of each pull-up and pull-down driver transistors coupled to the gate of a corresponding output driver transistor. With this arrangement, the conventional pre-driver circuit, and hence the output driver transistor coupled thereto, can be turned on and off under the control of the signal to be output.

Optionally, the slope control signal may be configured and generated by a digital register. With this arrangement, small overshoots in the output waveform or small SSN (i.e., a gently sloped transient current) can be simply achieved by configuring the slope control signal to a preset value (e.g., 0) using the digital register, which controls the pre-driver transistor to be turned off. In case of a small capacitive load, a high-frequency signal (e.g., a steeply sloped transient current) can be output by configuring the slope control signal to another preset value (e.g., 1) using the digital register. As a result, the pre-driver transistor is turned on, allowing the pre-driver circuit of the present to operate almost in the same manner as the conventional pre-driver circuit.

Optionally, when the output driver transistor is configured for pulling up, pull-down capability of the pull-down driver transistor may be weaker than pull-up capability of the pull-up driver transistor. Additionally, when the output driver transistor is configured for pulling down, the pull-down capability of the pull-down driver transistor may be stronger than the pull-up capability of the pull-up driver transistor. With this arrangement, under the control of the pre-driver circuit, the output driver transistor is turned on slowly and turned off quickly (i.e., an electrical level coupled to the gate of the output driver transistor transitions slowly to a level at which the output driver transistor is turned on, but quickly to a level at which the output driver transistor is turned off). As a result, the pull-down output driver transistor is turned off before the pull-up output driver transistor is turned on, or the pull-up output driver transistor is turned off before the pull-down output driver transistor is turned on. This avoids the occurrence of a shoot-through current from the power supply voltage through the output driver transistor to the ground.

Optionally, the GPIO circuit may comprise n output driver branches, where n is an integer greater than or equal to 2, wherein the pre-driver circuit further comprises a selection control circuit; a drain of each output driver transistor in a corresponding output driver branch is coupled to the GPIO pin; and the selection control circuit is based on the signal to be output and a selection control signal to provide the pre-driver circuits coupled to the output driver branches with drive signals, thereby selectively turning on some or all of the n output driver branches. With this arrangement, some or all of the n output driver branches can be selectively turned on, allowing the GPIO circuit to be more flexibly used in a wider range of applications.

Optionally, in order to achieve small overshoots in the output waveform, some of the n output driver branches may be turned on under the control of the selection control circuit. Additionally, in order to output a high-frequency signal, all the n output driver branches may be turned on under the control of the selection control circuit. With this arrangement, an output current with a reduced peak value can be obtained through turning on fewer output driver transistors, reducing simultaneous switching noise (SSN) in the output waveform.

Optionally, the selection control circuit may comprise a drive capability decoder circuit and n AND logic circuits, each AND logic circuit comprising an output terminal coupled to a corresponding pre-driver circuit to provide the corresponding pre-driver circuit with a drive signal, each AND logic circuit comprising a first input terminal coupled to a corresponding output of the drive power decoder circuit, each AND logic circuits comprising a second input coupled to the signal to be output. With this arrangement, the drive signals required by the respective pre-driver circuits to selectively turn on some or all of the n output driver branches can be generated by the simple decoder circuit and AND logic circuits based on the signal to be output and the selection control signal.

Optionally, in order to achieve small overshoots in the output waveform, some of the n output driver branches may be turned on under the control of the selection control circuit. Additionally, in order to output a high-frequency signal, all the n output driver branches may be turned on under the control of the selection control circuit. With this arrangement, an output current with a reduced peak value IP can be obtained through turning on fewer output driver transistors, reducing simultaneous switching noise (SSN).

Optionally, each output driver branches may comprise a corresponding pull-up output driver transistors, a ratio of width-to-length ratios of which is equal to a pull-down capability ratio of the SPD circuits in the pre-driver circuits coupled to the pull-up output driver transistors in the n output driver branches.

Additionally or alternatively, each output driver branches may comprise a corresponding pull-down output driver transistors, a ratio of width-to-length ratios of which is equal to a pull-up capability ratio of the SPD circuits in the pre-driver circuits coupled to the pull-down output driver transistors a corresponding. With this arrangement, the n output driver branches can be turned on at the same rate, reducing simultaneous switching noise (SSN).

Optionally, each output driver branch may comprise a pull-up output driver transistor and a pull-down output driver transistor, a drain of each of the pull-up and pull-down output driver transistors coupled to the GPIO pin, at least one of the pull-up and pull-down output driver transistors coupled to the said pre-driver circuit. With this arrangement, the pull-up and pull-down output driver transistors in each output driver branch can be separately turned on and off under the control of the corresponding pre-driver circuit, thus allowing the output driver branch to operate either in a push-pull output mode, or in an open-drain output mode.

Optionally, each of the pull-up and pull-down output driver transistors may be coupled to a pre-driver circuit which is said pre-driver circuit, wherein the pre-driver circuit that the pull-up output driver transistor is coupled to is a dual version of the pre-driver circuit that the pull-down output driver transistor is coupled to. With this arrangement, the gates of the pull-up and pull-down output driver transistors can be separately controlled, and when the pull-up and pull-down output driver transistors all operate normally and are alternately turned on and off, each pull-down output driver transistor is turned off before the corresponding pull-up output driver transistor is turned on, or each pull-up output driver transistor is turned off before the corresponding pull-down output driver transistor is turned on. This can prevent a shoot-through current from the power supply voltage VDD through the pull-up and pull-down output driver transistors to the ground.

Optionally, a gate of an MOS transistor in an SPD circuit corresponding to the pull-up output driver transistor may be coupled to a power supply voltage.

Additionally or alternatively, a gate of an MOS transistor in an SPD circuit corresponding to the pull-up output driver transistor may be coupled to a ground voltage. With this arrangement, each pair of pull-up and pull-down output driver transistors can be separately controlled by the respective SPD circuit.

Optionally, the SPD circuit may comprise a transistor having a width-to-length ratio smaller than 1. Alternatively, the SPD circuit may comprise an MOS transistor and a resistor connected in series with the MOS transistor. Still alternatively, the SPD circuit may comprise a reference current source and a current mirror coupled to the reference current source. With this arrangement, the SPD circuit has a simple design, and the gates of the output driver transistors can be pulled down more slowly through properly configuring a parameter of the SPD circuit (e.g., width-to-length ratio of the MOS transistor, resistance of the resistor, or magnitude of a reference current provided by the reference current source).

Optionally, the GPIO circuit may further comprise an input circuit coupled between the GPIO pin, which can receive an external signal and transmit it into the chip.

Optionally, the GPIO circuits coupled to a plurality of the GPIO pins may be simultaneously turned on or off under the control of a single slope control signal. This enables multiple GPIO pins in the chip to simultaneously output signals within a short time interval.

Optionally, the chip may further comprise a digital register, wherein the GPIO circuits coupled to the GPIO pins in the chip are divided into m groups, and wherein the slope control signal required by each group is same and the slope control signals for respective groups are sequentially stored in the digital register. With this arrangement, the pre-driver transistors in the GPIO circuits can be simply turned off or on simply by configuring the slope control signal to desired values using the digital register.

The description presented above is merely that of some preferred embodiments of the present invention and is not intended to limit the scope thereof in any sense. Any and all changes and modifications made by those of ordinary skill in the art based on the above teachings fall within the scope of the invention.

What is claimed is:

1. A general-purpose input/output (GPIO) circuit, comprising at least one output driver branch each including output driver transistors, wherein: each output driver transistor comprises a drain coupled to a GPIO pin; and a gate coupled to a corresponding pre-driver circuit, wherein the pre-driver circuit comprises:

a conventional pre-driver circuit, comprising an input terminal coupled to a signal to be output and an output terminal coupled to a gate of a corresponding output driver transistor;

a pre-driver transistor, comprising a gate coupled to a slope control signal and a drain coupled to one terminal of the conventional pre-driver circuit; and a slow pre-driver (SPD) circuit, coupled between a source and the drain of the pre-driver transistor, wherein the SPD circuit comprises a reference current source and a current mirror coupled to the reference current source;

wherein when the slope control signal is so configured that the pre-driver transistor is turned on, and the SPD circuit and the conventional pre-driver circuit are turned on, the output driver transistor is turned on in a normal mode; or wherein when the slope control signal is so configured that the pre-driver transistor is turned off, and the SPD circuit and the conventional pre-driver circuit are turned on, the output driver transistor is turned on in a slope-controlled mode, in which the output driver transistor is turned on more slowly than in the normal mode.

2. The GPIO circuit of claim 1, wherein in the slope-controlled mode, the output driver transistor drives a transient current output from the GPIO pin with a slope that is gentler than a slope of a transient current output in the normal mode.

3. The GPIO circuit of claim 1, wherein when a corresponding output driver transistor is configured for pulling up, the drain of the pre-driver transistor is coupled to a ground terminal of the conventional pre-driver circuit, the source of the pre-driver transistor is grounded, and wherein a pull-down capability of the pre-driver transistor is stronger than a pull-down capability of the SPD circuit, and wherein when a corresponding output driver transistor is configured for pulling down, the source of the pre-driver transistor is coupled to a power supply voltage, the drain of the pre-driver transistor is coupled to a power supply input of the conventional pre-driver circuit, and wherein a pull-up capability of the pre-driver transistor is stronger than a pull-up capability of the SPD circuit.

4. The GPIO circuit of claim 3, wherein the conventional pre-driver circuit comprises a pull-up driver transistor and a pull-down driver transistor, wherein a gate of each of the pull-up and pull-down driver transistors is coupled to the signal to be output, and wherein a drain of each of the pull-up and pull-down driver transistors is coupled to a gate of a corresponding output driver transistor.

5. The GPIO circuit of claim 1, wherein the slope control signal is configured and generated by a digital register.

6. The GPIO circuit of claim 1, wherein when the output driver transistor is configured for pulling up, a pull-down capability of the pull-down driver transistor is weaker than a pull-up capability of the pull-up driver transistor, and wherein when the output driver transistor is configured for pulling down, the pull-down capability of the pull-down driver transistor is stronger than the pull-up capability of the pull-up driver transistor.

7. The GPIO circuit of claim 1, comprising n output driver branches, where n is an integer equal to or greater than 2, wherein the pre-driver circuit further comprises a selection control circuit, wherein: a drain of each output driver transistor in a corresponding output driver branch is coupled to the GPIO pin; and the selection control circuit is based on the signal to be output and a selection control signal to provide the pre-driver circuits coupled to the output driver branches with drive signals, thereby selectively turning on some or all of the n output driver branches.

8. The GPIO circuit of claim 7, wherein in order to achieve small overshoots in an output waveform, under a control of the selection control circuit, some of the n output driver branches are turned on, and wherein in order to output a high-frequency signal, under the control of the selection control circuit, each output driver branch is turned on.

9. The GPIO circuit of claim 7, wherein the selection control circuit comprises a drive capability decoder circuit and n AND logic circuits, wherein each AND logic circuit comprises an output terminal coupled to a corresponding pre-driver circuit to provide the corresponding pre-driver circuit with a drive signal, wherein each AND logic circuit comprise a first input terminal coupled to a corresponding output of the drive power decoder circuit, and wherein each AND logic circuit comprises a second input terminal coupled to the signal to be output.

10. The GPIO circuit of claim 7, wherein each output driver branch comprises a corresponding pull-up output driver transistor, wherein a ratio of width-to-length ratios of the pull-up output driver transistors in the n output driver branches is equal to a pull-down capability ratio of the SPD circuits in the pre-driver circuits coupled to the pull-up output driver transistors in the n output driver branches.

11. The GPIO circuit of claim 7, wherein each output driver branch comprises a corresponding pull-down output driver transistor, wherein a ratio of width-to-length ratios of the pull-down output driver transistors in the n output driver branches is equal to a pull-up capability ratio of the SPD circuits in the pre-driver circuits coupled to the pull-down output driver transistors in the n output driver branches.

12. The GPIO circuit of claim 1, wherein each output driver branch comprises a pull-up output driver transistor (MP) and a pull-down output driver transistor (MN), wherein a drain of each of the pull-up and pull-down output driver transistors is coupled to the GPIO pin, and wherein at least one of the pull-up and pull-down output driver transistors is coupled to the pre-driver circuit.

13. The GPIO circuit of claim 12, wherein each of the pull-up and pull-down output driver transistors is coupled to the pre-driver circuit, and wherein the pre-driver circuit that the pull-up output driver transistor is coupled to is a dual version of the pre-driver circuit that the pull-down output driver transistor is coupled to.

14. The GPIO circuit of claim 1, further comprising an input circuit coupled to the GPIO pin.

15. A chip, comprising a logical processing unit, at least one GPIO pin and at least one GPIO circuit each coupled between the logical processing unit and a corresponding GPIO pin, wherein the at least one GPIO circuit coupled to the at least one GPIO pin is implemented as the GPIO circuit of claim 1.

16. The chip of claim 15, wherein a single slope control signal is used to simultaneously turn on or off the at least one GPIO circuit coupled to the at least one GPIO pin.

17. The chip of claim 15, further comprising a digital register, wherein the GPIO circuits coupled to the GPIO pins in the chip are divided into m groups, wherein the slope control signal required by each group is same and the slope control signals for respective groups are sequentially stored in the digital register.

* * * * *